(12) United States Patent
Ogata

(10) Patent No.: US 7,569,922 B2
(45) Date of Patent: Aug. 4, 2009

(54) SEMICONDUCTOR DEVICE HAVING A BONDING WIRE AND METHOD FOR MANUFACTURING THE SAME

(75) Inventor: Yoshiharu Ogata, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/835,493

(22) Filed: Aug. 8, 2007

(65) Prior Publication Data

US 2007/0278646 A1 Dec. 6, 2007

(51) Int. Cl.
*H01L 23/52* (2006.01)
*H01L 25/18* (2006.01)
*H01L 25/07* (2006.01)
*H01L 25/065* (2006.01)
*H01L 23/48* (2006.01)

(52) U.S. Cl. ............... 257/686; 257/E23.085; 257/E23.141; 257/E25.013; 257/E23.114; 257/E23.021; 257/E23.172; 257/E25.023; 257/E25.03; 257/777; 257/723; 257/678; 257/784; 257/786; 257/725; 257/778

(58) Field of Classification Search ........... 257/686, 257/777, 778, 776, 796, 678, 784, 786, 723, 257/725, E23.085, E23.141, E25.013, E23.114, 257/E23.021, E23.172, E25.023, E23.03
See application file for complete search history.

(56) References Cited

U.S. PATENT DOCUMENTS

| | | | |
|---|---|---|---|
| 7,217,993 B2 * | 5/2007 | Nishimura | 257/686 |
| 7,354,800 B2 * | 4/2008 | Carson | 438/109 |
| 7,364,946 B2 * | 4/2008 | Karnezos | 438/109 |
| 2004/0051170 A1 * | 3/2004 | Kawakami et al. | 257/686 |
| 2006/0102992 A1 * | 5/2006 | Kwon et al. | 257/685 |

FOREIGN PATENT DOCUMENTS

| | | |
|---|---|---|
| JP | 3681690 | 8/2003 |
| JP | 2004-296897 | 10/2004 |
| JP | 2004-303992 | 10/2004 |
| JP | 2005-017197 | 1/2005 |
| JP | 2005-017198 | 1/2005 |
| JP | 2005-026639 | 1/2005 |
| JP | 2005-129847 | 5/2005 |
| JP | 2006-060128 | 3/2006 |
| JP | 2006-173434 | 6/2006 |
| JP | 2006-173435 | 6/2006 |

* cited by examiner

*Primary Examiner*—Alexander O Williams
(74) *Attorney, Agent, or Firm*—Harness, Dickey & Pierce, P.L.C.

(57) ABSTRACT

A semiconductor device includes: a first semiconductor chip face-down mounted on a substrate; a second semiconductor chip face-up mounted on the first semiconductor chip; an electromagnetic shielding plate inserted between the first semiconductor chip and the second semiconductor chip; and a bonding wire bonded on the substrate so as to be astride of the electromagnetic shielding plate.

11 Claims, 1 Drawing Sheet

SEMICONDUCTOR DEVICE HAVING A BONDING WIRE AND METHOD FOR MANUFACTURING THE SAME

BACKGROUND OF THE INVENTION

1. Technical Field

The present invention relates to a semiconductor device and a method for manufacturing a semiconductor device. The present invention is particularly suitable for multi-stacked structure of the semiconductor chip.

2. Related Art

As to the conventional semiconductor devices, there has been widely used a method for stacking a semiconductor chip face-up mounted semiconductor chip on a semiconductor chip face-down mounted in order to achieve a high-density package of a semiconductor package.

Further, JP-3681690, for example, discloses a method, according to which a conductive layer is formed on the back surface of a second semiconductor chip mounted on a first semiconductor chip in order to suppress interference due to noise between the stacked semiconductor chips.

However, according to the stacked structure of a conventional semiconductor chip, there arises a problem of interference due to noise between the stacked semiconductor chips, resulting in the decrease of reliability of a semiconductor device. Furthermore, according to the method disclosed in JP-3681690, a conductive layer must be formed on the back surface of the second semiconductor chip mounted on the first semiconductor chip, so the manufacturing process of the second semiconductor chip becomes disadvantageously complicated.

SUMMARY

An advantage of the present invention is to provide a semiconductor device and a method for manufacturing a semiconductor device capable of stacking chips on one another while suppressing interference due to noise between the chips.

A semiconductor device according to one aspect of the invention includes a first semiconductor chip that is face-down mounted on a substrate; a second semiconductor chip that is face-up mounted on the first semiconductor chip; an electromagnetic shielding plate that is inserted between the first semiconductor chip and the second semiconductor chip; and a bonding wire that is bonded on the substrate so as to be astride of the electromagnetic shielding plate.

As a result, even in the case when the second semiconductor chip is stacked on the first semiconductor chip, it becomes possible to suppress interference due to noise between the first semiconductor chip and the second semiconductor chip. At the same time, it is possible to ground the electromagnetic shielding plate without forming the conductive layer on the back surface of the first semiconductor chip or the second semiconductor chip. Therefore, the electromagnetic shielding effect between the first semiconductor chip and the second semiconductor chip can be enhanced without involving complication of the manufacturing process of the first semiconductor chip and the second semiconductor chip, and the packaging density of the semiconductor chips can be enhanced while suppressing the increase in cost.

A semiconductor device according to a second aspect of the invention includes: a first semiconductor chip that is face-down mounted on a substrate; a dummy chip that is arranged on the first semiconductor chip and having a conductive layer formed on the upper surface of the dummy chip; a bonding wire that is bonded on the substrate and contacting the conductive layer so as to be astride of the dummy chip; and a second semiconductor chip that is face-up mounted on the dummy chip through the intermediation of the bonding wire.

By thus holding the dummy chip between the first semiconductor chip and the second semiconductor chip, the interference due to noise between the first semiconductor chip and the second semiconductor chip can be suppressed, and the conductive layer formed on the upper surface of the dummy chip can be grounded without forming the conductive layer on the back surface of the first semiconductor chip or the second semiconductor chip. Therefore, it becomes possible to enhance the electromagnetic shielding effect between the first semiconductor chip and the second semiconductor chip without involving complication of the manufacturing process of the first semiconductor chip and the second semiconductor chip, and the packaging density of the semiconductor chips can be enhanced while suppressing the increase in cost.

In this case, the semiconductor device may further include an electronic part arranged under the second semiconductor chip and mounted on the substrate.

As a result, it becomes possible to stack the second semiconductor chip and the electronic part on the substrate, thereby making it possible to suppress the increase in mounting area.

In this case, it is preferable that the second semiconductor chip be larger than the first semiconductor chip.

As a result, it is possible to arrange the electronic part under the second semiconductor chip while the electronic part is not in contact with the first semiconductor chip arranged under the second semiconductor chip, thereby making it possible to suppress the increase in the mounting area.

Further, it is preferable that an analog IC be formed on the first semiconductor chip; and a digital IC be formed on the second semiconductor chip.

As a result, even when the analog IC and the digital IC are stacked on the same substrate, it becomes possible to suppress interference due to noise between the analog IC and the digital IC, thereby making it possible to suppress deterioration of the characteristics of the analog IC and the digital IC while suppressing the increase in the mounting area.

A method for manufacturing a semiconductor device according to a third aspect of the invention includes: face-down mounting a first semiconductor chip on a substrate; arranging a dummy chip on the first semiconductor chip, the dummy chip having a conductive layer formed on the upper surface of the dummy bump; bonding a bonding wire on the substrate so that the bonding wire is astride of the dummy chip; and face-up mounting the second semiconductor chip on the dummy chip through the intermediation of the bonding wire.

By thus mounting the dummy chip between the first semiconductor chip and the second semiconductor chip and adding the bonding step, it becomes possible to suppress interference due to noise between the first semiconductor chip and the second semiconductor chip. At the same time, the conductive layer formed on the upper surface of the dummy chip can be grounded and the packaging density of the semiconductor chips can be enhanced while suppressing the increase in cost.

In this case, it is preferable that in the bonding of the bonding wire on the substrate, the conductive layer and the bonding wire be prevented from contacting each other; and that in the mounting of the second semiconductor chip, the bonding wire be pressurized by the second semiconductor chip and the bonding wire and the conductive layer be brought into contact with each other.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a semiconductor device according to an embodiment of the invention will be described with reference to the drawings.

Figure 1A:
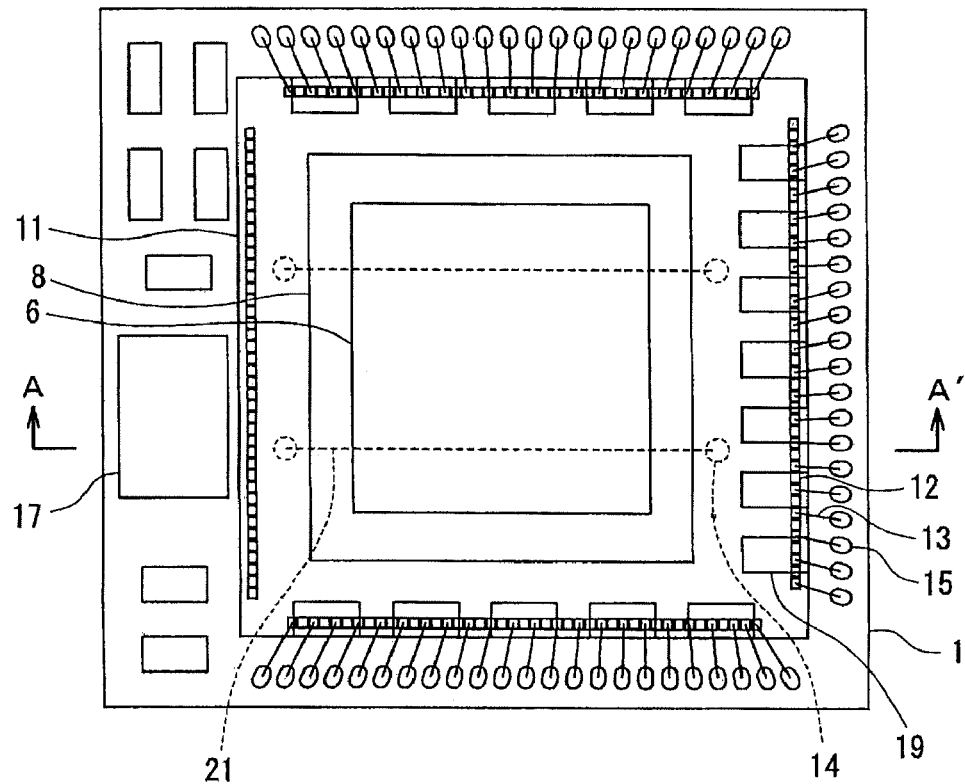
FIG. 1A is a plan view schematically illustrating a construction of the semiconductor device according to an embodiment of the invention.
Figure 1B:
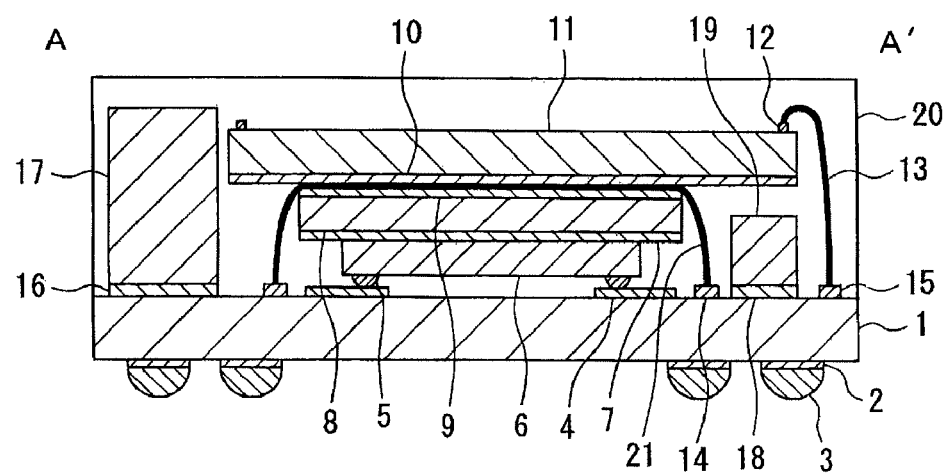
FIG. 1B is a section view taken along with the line A-A' of FIG. 1A.

FIG. 1A is a plan view schematically illustrating a construction of the semiconductor device according to the embodiment of the invention and FIG. 1B is a section view taken along with the line A-A' of FIG. 1A.

As shown in FIG. 1A and FIG. 1B, a land 2 is provided on the back surface of a carrier substrate 1 and a projecting electrode is formed on the land 2. Further, on the surface of the carrier substrate 1, there are provided a terminal electrode bonding the projecting electrode 5, terminal electrodes 15, 14 respectively connecting bonding wires 13, 21, and terminal electrodes 16, 18 respectively connecting electronic parts 17, 19. As the carrier substrate 1, a double-side board, a multilayer wiring board, a subcomposite, a tape substrate, a film substrate etc. can be used. As the material for the carrier substrate 1, a polyimide resin, a glass epoxy resin, a BT resin, a composite of aramid and epoxy, ceramics etc. can be used. Furthermore, as the projecting electrode 3, an Au bump, a Cu bump coated by solder materials, a Ni bump or a solder ball can be used.

Further, the projecting electrode 5 is formed on a semiconductor chip 6, a conductive layer 9 is formed on the upper surface of a dummy chip 8, and an electrode pad 12 is formed on a semiconductor chip 11. It is possible to mount an analog IC as the semiconductor chip 6 and to mount a digital IC as the semiconductor chip 11.

As the dummy chip 8, a bare chip made by a semiconductor such as Si can be used. As the conductive layer 9, a metal layer made from Al or Cu can be used. The layer thickness of the conductive layer 9 can be made about 10000 Å. In this case, the conductive layer 9 and the dummy chip 8 can be formed as follows: First, a wafer made by a semiconductor such as Si is prepared. In this case, the wafer may be one having such a size as to form a plurality of dummy chips 8. Then, a metal film such as Al or Cu is formed as the conductive layer 9 on the entire surface of one surface of this wafer by using sputtering method, chemical vapor deposition (CVD) method, plating method etc. Finally, the wafer, on which the conductive layer 9 is formed, is cut into such pieces having such a size as to be used as the dummy chip 8, thereby making it possible to form the conductive layer 9 and the dummy chip 8. It is also possible to, before cutting the wafer into pieces, form a adhesive layer 7 on the entire surface of the back surface of the wafer (the opposite surface of the surface, on which the conductive layer 9 is formed) and then cut the wafer into pieces.

Instead of the dummy chip 8 with the conductive layer 9 formed, an electromagnetic shielding plate such as metal plate or ferrite plate may be used.

The semiconductor chip 6 is face-down mounted on the carrier substrate 1 through the intermediation of the projecting electrode 5. The projecting electrode 5 is bonded to the terminal electrode 4. Note that in the case of bonding the projecting electrode 5 and the terminal electrode 4 metal bonding such as soldier bonding or alloy bonding may be performed or pressure bonding such as Anisotropic Conductive Film (ACF) bonding, Nonconductive Film (NCF) bonding, Anisotropic Conductive Paste (ACP) bonding or Nonconductive Paste (NCP) bonding may be used.

The dummy chip 8 with the conductive layer 9 formed on its upper surface is arranged on the semiconductor chip 6 through the intermediation of the adhesive layer 7. The adhesive layer 7 and the dummy chip 8 may have substantially the same size when seen in the plan view. In other words, the lateral surface of the adhesive layer 7 and the lateral surface of the dummy chip 8 may be formed so as to be flush with each other.

The bonding wire 21 is arranged on the conductive layer 9 such that it is bonded to the terminal electrode 14 so as to be astride of the dummy chip 8 in an arched manner. It can be said that the bonding wire 21 is, seen in the plan view, is continuously formed on the two terminal electrodes 14 holding the dummy chip 8 therebetween and on the conductive layer 9. The semiconductor chip 11 is face-up mounted on the bonding wire 21 through the intermediation of the adhesive layer 10. Note that the adhesive layer 10 and the semiconductor chip 11 may have substantially the same size when seen in the plan view. In other words, the lateral surface of the adhesive layer 10 and the lateral surface of the semiconductor chip 11 may be formed so as to be flush with each other.

When the bonding wire 21 is arranged on the dummy chip 8, it is preferable that a plurality of bonding wires 21 be arranged in parallel in order to prevent the semiconductor chip 11 on the bonding wire 21 from tilting. The bonding wire 21 and the semiconductor chip 11 can be formed, for example, as follows: First, the bonding wire 21 is bonded to the terminal electrode 14 so as to be astride of the dummy chip 8 in an arched manner. In this case, the bonding wire 21 may be formed to be in contact with the conductive layer 9. However, the bonding wire 21 may be bonded such that it is not in contact with the conductive layer (there is a space between the bonding wire 21 and the conductive layer 9). Next, the semiconductor chip 11 is arranged on the dummy chip 8 (and on the bonding wire 21). When the bonding wire 21 is not in contact with the conductive layer 9, at the time of arranging the semiconductor chip 11, the bonding wire 21 may be pressurized by the semiconductor chip 11 prior to the arrangement of the semiconductor chip 11 and then the bonding wire 21 and the conductive layer 9 may be brought into contact with each other.

The electrode pad 12 provided on the semiconductor chip 11 is bonded to the terminal electrode 15 through the intermediation of the bonding wire 13, and the semiconductor chip 11 is electrically connected to the carrier substrate 1 through the intermediation of the bonding wire 13. Further, at the lateral side of the semiconductor chip 11, the electronic part 17 is mounted on the carrier substrate 1 through the intermediation of the terminal electrode 16. Under the semiconductor chip 11, the electronic part 19 is mounted on the carrier substrate 1 through the intermediation of the terminal electrode 18. Note that as the electronic part 19 a resistance, a capacitor, a coil, a connector or the like may be used. The semiconductor chip 11, to which the bonding wire 13 is connected, and the electronic part 17, 19 are sealed by a sealing resin 20.

As a result, even if the semiconductor chip 11 is stacked on the semiconductor chip 8, the interference between the semiconductor chips 8, 11 due to noise can be prevented and the conductive layer 9 can be grounded without forming any conductive layer on the back surface of the semiconductor chips 8, 11. Therefore, it is possible to enhance the electromagnetic shielding effect between the semiconductor chips 8, 11 without involving the complication of the manufacturing process of the semiconductor chips 8, 11, and to suppress the increase in cost and to improve the packaging density of the semiconductor chips 8, 11.

It is preferable that the semiconductor chip 6, the dummy chip 8, and the semiconductor chip 11 are structured so as to be in the increasing order of the size. That is to say, it is preferable that the dummy chip 8 be larger than the semiconductor chip 6 and the semiconductor chip 11 be larger than the dummy chip 8. As a result, it is possible to arrange the electronic part 19 under the semiconductor chip 11 while not contacting the semiconductor chip 6 and the dummy chip 8 arranged under the semiconductor chip 11, thereby making it possible to suppress the increase in the mounting area. Further, the thickness of the dummy chip 8 can be set such that the electronic part 19 is not in contact with the semiconductor chip 11. That is to say, the thickness of the dummy chip 8 and the conductive layer 9 may be set such that the upper surface of the conductive layer 9 (the surface opposite to the surface facing the dummy chip 8 of the conductive layer 9) is larger than the upper surface of the electronic part 19 (the surface opposite to the surface facing the carrier substrate 1 of the electronic part 19). As a result, it is possible to prevent the electronic part 19 from being in contact with the semiconductor chip 11 and the dummy chip 8 can be also used as a spacer, thereby making it possible to arrange the electronic part 19 under the semiconductor chip 11 while preventing the complication of the manufacturing process.

Further, the carrier substrate 1 with the semiconductor chips 6, 11 mounted thereon can be applied to electronic equipment such as a liquid crystal display apparatus, a portable phone, a PDS, a video camera, a digital camera, a Mini Disc (MD) player, an IC card and an IC tag, thereby making it possible to enhance the reliability of the electronic equipment while achieving the miniaturization and the weight saving of the electronic equipment.

While in the above-described embodiment the method for mounting a semiconductor chip has been explained as an example, the invention is not necessarily limited to this method for mounting a semiconductor chip. The invention may be applied to, for example, the method for mounting a resistance, a capacitor or a connector and to the method for mounting a ceramic element such as a surface acoustic wave (SAW) element, an optical element such as a light modulator or a light switch or various sensors such as a magnetic sensor or a biosensor.

What is claimed is:

1. A semiconductor device, comprising:
   a substrate that has a first electrode and a second electrode;
   a first semiconductor chip that is face-down mounted on the substrate;
   a second semiconductor chip that is face-up mounted on the first semiconductor chip;
   an electromagnetic shielding plate that is inserted between the first semiconductor chip and the second semiconductor chip, the electromagnetic shielding plate being positioned between the first electrode and the second electrode in a plan view; and
   a bonding wire that has a first portion, a second portion and a third portion, the first portion of the bonding wire being bonded to the first electrode, the second portion of the bonding wire being bonded to the second electrode, the third portion of the bonding wire being disposed on the electromagnetic shielding plate.

2. A semiconductor device, comprising:
   a substrate that has a first electrode and a second electrode;
   a first semiconductor chip that is face-down mounted on the substrate;
   a dummy chip that is arranged on the first semiconductor chip, the dummy chip having a first surface and a second surface, the first surface of the dummy chip facing the first semiconductor chip, the second surface of the dummy chip being opposite to the first surface of the dummy chip;
   a conductive layer that is formed on the second surface of the dummy chip, the conductive layer being positioned between the first electrode and the second electrode in a plan view;
   a bonding wire that has a first portion, a second portion and a third portion, the first portion of the bonding wire being bonded to the first electrode, the second portion of the bonding wire being bonded to the second electrode, the third portion of the bonding wire being disposed on the shielding plate; and
   a second semiconductor chip that is face-up mounted on the dummy chip so that the bonding wire is positioned between the semiconductor chip and the dummy chip.

3. The semiconductor device according to claim 1, further comprising an electronic part that is arranged under the second semiconductor chip, the electronic part being mounted on the substrate.

4. The semiconductor device according to claim 1, wherein the second semiconductor chip is larger than the first semiconductor chip.

5. The semiconductor device according to claim 1, wherein:
   an analog IC is formed on the first semiconductor chip; and
   a digital IC is formed on the second semiconductor chip.

6. A method for manufacturing a semiconductor device, comprising:
   face-down mounting a first semiconductor chip on a substrate, the substrate having a first electrode and a second electrode;
   arranging a dummy chip on the first semiconductor chip having a conductive layer formed on a first surface of the dummy chip so that a second surface of the dummy chip opposite to the first surface of the dummy chip faces to the first semiconductor and the conductive layer is positioned between the first electrode and the second electrode in a plan view;
   bonding a bonding wire so that a first portion of the bonding wire is bonded to the first electrode, a second portion of the bonding wire is bonded to the second electrode, and a third portion of the bonding wire is disposed on the conductive layer; and
   face-up mounting a second semiconductor chip on the dummy chip so that the bonding wire is positioned between the semiconductor chip and the dummy chip.

7. The method for manufacturing a semiconductor device according to claim 6, wherein:
   in the bonding of the bonding wire on the substrate, the conductive layer and the bonding wire are prevented from contacting each other; and
   in the mounting of the second semiconductor chip, the bonding wire is pressurized by the second semiconductor chip and the bonding wire and the conductive layer are brought into contact with each other.

8. The semiconductor device according to claim 2, wherein the second semiconductor chip is larger than the dummy chip.

9. The semiconductor device according to claim 2, wherein the dummy chip is made of a semiconductor material.

10. The semiconductor device according claim 6, wherein the second semiconductor chip is larger than the dummy chip.

11. The semiconductor device according to claim 6, wherein the dummy chip is made of a semiconductor material.

* * * * *